(12) United States Patent
Zhang et al.

(10) Patent No.: US 10,210,041 B2
(45) Date of Patent: Feb. 19, 2019

(54) SYSTEMS AND METHODS FOR LOW LATENCY COPY OPERATIONS IN NON-VOLATILE MEMORY

(71) Applicant: SK Hynix Inc., Gyeonggi-do (KR)

(72) Inventors: Fan Zhang, Fremont, CA (US); Yu Cai, San Jose, CA (US); June Lee, Sunnyvale, CA (US)

(73) Assignee: SK Hynix Inc., Gyeonggi-do (KR)

( * ) Notice: Subject to any disclaimer, the term of this patent is extended or adjusted under 35 U.S.C. 154(b) by 127 days.

(21) Appl. No.: 15/137,987

(22) Filed: Apr. 25, 2016

(65) Prior Publication Data

US 2017/0132074 A1 May 11, 2017

Related U.S. Application Data

(60) Provisional application No. 62/251,519, filed on Nov. 5, 2015.

(51) Int. Cl.
| | | |
|---|---|---|
| *G06F 11/00* | (2006.01) | |
| *G06F 11/10* | (2006.01) | |
| *G06F 3/06* | (2006.01) | |
| *G11C 29/52* | (2006.01) | |
| *G11C 29/04* | (2006.01) | |

(52) U.S. Cl.
CPC ........ *G06F 11/1068* (2013.01); *G06F 3/0619* (2013.01); *G06F 3/0647* (2013.01); *G06F 3/0679* (2013.01); *G11C 29/52* (2013.01); *G11C 2029/0411* (2013.01)

(58) Field of Classification Search
CPC .................................................. G06F 11/1068
See application file for complete search history.

(56) References Cited

U.S. PATENT DOCUMENTS

| | | | |
|---|---|---|---|
| 8,130,554 B1 | 3/2012 | Linnell | |
| 8,433,981 B1* | 4/2013 | Agarwal | G06F 11/1068 714/773 |
| 8,443,263 B2* | 5/2013 | Selinger | G06F 11/1068 714/768 |
| 8,456,905 B2* | 6/2013 | Kasorla | G06F 12/0246 365/185.02 |
| 8,924,832 B1* | 12/2014 | Lam | G06F 12/06 702/117 |
| 9,158,621 B2 | 10/2015 | Sharon | |
| 9,256,491 B1* | 2/2016 | Dropps | G06F 11/1048 |
| 9,378,097 B1* | 6/2016 | Bellorado | G06F 11/076 |
| 2005/0044467 A1* | 2/2005 | Leung | G06F 11/1048 714/763 |
| 2009/0172498 A1 | 7/2009 | Shlick | |
| 2009/0193058 A1 | 7/2009 | Reid | |
| 2009/0259806 A1* | 10/2009 | Kilzer | G06F 12/0246 711/103 |

(Continued)

*Primary Examiner* — Elmira Mehrmanesh
(74) *Attorney, Agent, or Firm* — Kilpatrick Townsend & Stockton

(57) ABSTRACT

Techniques and systems are provided for copying, with or without error-fixing or corrections, data associated with a first set of locations to a second set of locations in a flash memory. Example methods disclosed, when performed by a flash memory controller, can significantly improve latency of operations. Embodiments of the disclosure can be used, for example, in a garbage collection process of a NAND flash memory.

19 Claims, 10 Drawing Sheets

(56) References Cited

U.S. PATENT DOCUMENTS

| | | | |
|---|---|---|---|
| 2009/0327591 A1* | 12/2009 | Moshayedi | G06F 11/1441 711/103 |
| 2013/0117620 A1* | 5/2013 | Joo | G11C 16/10 714/746 |
| 2013/0159815 A1* | 6/2013 | Jung | G06F 11/10 714/773 |
| 2014/0136883 A1* | 5/2014 | Cohen | G06F 11/2094 714/6.11 |
| 2015/0006792 A1 | 1/2015 | Lee | |
| 2015/0052415 A1* | 2/2015 | Um | G06F 11/1056 714/768 |
| 2015/0193299 A1 | 7/2015 | Hyun | |
| 2017/0102991 A1* | 4/2017 | Haratsch | G06F 11/1008 |

\* cited by examiner

SYSTEMS AND METHODS FOR LOW LATENCY COPY OPERATIONS IN NON-VOLATILE MEMORY

CROSS-REFERENCES TO RELATED APPLICATIONS

This application is a non-provisional application and claims the benefit and priority of U.S. Provisional Application No. 62/251,519, filed on Nov. 5, 2015, titled "EFFICIENT GARBAGE COLLECTION USING COPY BACK COMMANDS," which is herein incorporated by reference in its entirety for all purposes.

FIELD

The present invention relates generally to systems, methods and apparatus for storage devices, and specifically to improving performance of non-volatile memory devices.

BACKGROUND

Non-volatile memory devices such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' or 'flash memory devices' (for example, NAND and NOR flash memory devices), are used in media storage, cameras, mobile phones, mobile computers, laptop computers, USB flash drives, etc. Non-volatile memory provides a relatively reliable, compact, cost-effective, and easily accessible method of storing data when the power is off.

Several operations can require data from a first set of locations to be copied to a second set of locations within a flash memory device. One example of such an operation is the recycling of blocks during the 'garbage collection' process. Garbage collection is deployed in many storage systems, such as solid-state disk drives, where there are physical limitations on in-place data update. As part of the garbage collection process in a NAND flash memory device, data from a 'victim' block is copied—either as is, or with corrections—to a 'target' block in the flash memory device so that the victim block can be erased and made available.

SUMMARY

Embodiments of the invention pertain to systems, methods, and computer-readable instructions for copying and/or moving data from one location to another in a flash memory. 'Moving' or 'copying' as used in this description can include both copying as-is and/or copying with changes or corrections. Moving or copying can also broadly refer to scenarios where the original source data is maintained, and/or scenarios where the original source data is subsequently erased.

According to some embodiments, a method for moving data in the flash memory can comprise reading, by a flash memory controller, data associated with a first set of locations from the flash memory. In examples, the data associated with the first set of locations can be copied from the flash memory to a flash buffer and then read into the flash memory controller. The method can further comprise estimating, at the flash memory controller, at least one error location in the data associated with the first set of locations. Information identifying the at least one error location can be sent from the flash memory controller for error-fixing. The error-fixing can operate on a copy of the data associated with the first set of locations to result in corrected data associated with the first set of locations. In examples, the copy of the data associated with the first set of locations can be present in the flash buffer.

The method can further comprise issuing, from the flash memory controller, a command that causes the corrected data associated with the first set of locations to be stored in a second set of locations of the flash memory, the second set of locations different from the first set of locations. In examples, the command that causes the corrected data associated with the first set of locations to be stored in a second set of locations can comprise a copy back command. In examples, the command can be a modified version of a copy back command.

In some embodiments, the moving data in the flash memory can occur as part of a garbage collection process in a NAND flash memory device.

In some embodiments, estimating the at least one error location in the data associated with the first set of locations can comprise applying an Error Correction Code (ECC) algorithm to the data associated with the first set of locations. In examples, this estimation can occur at the flash memory controller.

In some embodiments, the first set of locations and the second set of locations can be on the same plane of the flash memory. In other embodiments, the first set of locations can be on a first plane of the flash memory, whereas the second set of locations can be on a second plane of the flash memory. In such embodiments, the second plane can be different from the first plane but on the same die. In some embodiments, the first set of locations and the second set of locations can be on different dies of the flash memory.

In some embodiments, the sending the information identifying the at least one error location can be based on a condition being satisfied. The condition being satisfied can be based on a count of locations with errors in the first set of locations. More particularly, in examples, the condition being satisfied can be based on the count of locations with errors in the first set of locations being higher than a threshold number of locations. In other examples, the condition being satisfied can be based on the percentage of locations with errors in the first set of locations exceeding a threshold percentage.

In some embodiments, the error-fixing can comprise a binary flip of a bit at the one error location in the copy of the data associated with the first set of locations. In some embodiments, the error-fixing occurs at a flash buffer coupled to the flash memory.

DETAILED DESCRIPTION

Figure 1:
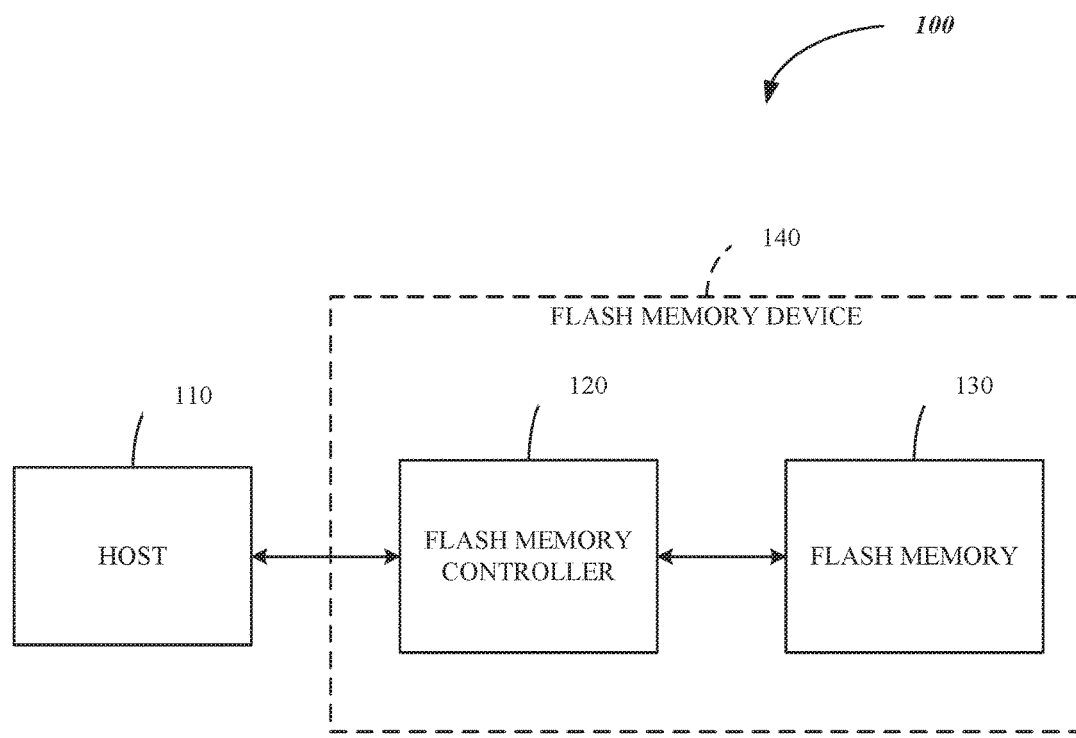
FIG. 1 is a block diagram illustrating a system including a host, a controller, and a non-volatile memory according to embodiments.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments. However, it will be apparent that various embodiments may be practiced without these specific details. The figures and description are not intended to be restrictive.

The ensuing description provides examples, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

The following detailed description together with the accompanying drawings in which the same reference numerals are sometimes used in multiple figures to designate similar or identical structures structural elements, provide a better understanding of the nature and advantages of the present invention.

Embodiments of the invention pertain to systems, methods, and computer-readable instructions for copying and/or moving data from one location to another in a flash memory. For example, embodiments can be used in 'garbage collection' process. More specifically, methods, systems, and computer-readable media as described in the disclosure can be used, for example, to recycle blocks in a NAND flash memory device.

More generally, methods, systems, and computer-readable media as described in the disclosure can be used to copy data from a first set of locations to a second set of locations in a flash memory. According to some embodiments, such copying can also including error-fixing.

Several processes in flash memory devices can introduce latency and affect the speed and performance of the device from a user perspective. Of these processes, some can involve copying data from one set of locations to another because of limitations in in-place updating of data in some flash memory devices. For example, processes such as garbage collection, data cycling from read disturb and retention losses can require data to be copied. Copying data from one location to another can introduce significant latency, thereby negatively impacting user experience.

Data associated with or present in the first set of locations (which needs to be copied) can have errors from various sources. Before data is copied from one location to another, errors in the data may need to be corrected to avoid propagation as the data is moved from one location to another. Error correction algorithms are capable of correcting these errors to some extent; however, if the number of errors in the data is large, error correction may not be able to fix all errors. The process of copying data from the first set of locations to the second set of locations can introduce further errors.

Embodiments of solutions presented can involve various methods of correcting errors in the data associated with the first set of locations before being copied to a second set of locations. In examples, upon determining error locations in the data associated with the first set of locations by the ECC decoder of the flash memory controller, the flash memory controller can send information identifying these error locations. The error locations can be used, for example by the flash memory, for error fixing to generate corrected data associated with the first set of locations. Examples will be provided with reference to FIGS. 6 and 7. Sending error locations in the first set of locations instead of encoding and sending all the data associated with the first set of locations can significantly reduce latency as described below. In some embodiments, latency can be reduced by determining that errors in the first set of locations need not be corrected during the copy, and are better left to be corrected by ECC later. Examples will be provided with reference to FIG. 5.

Figure 2:
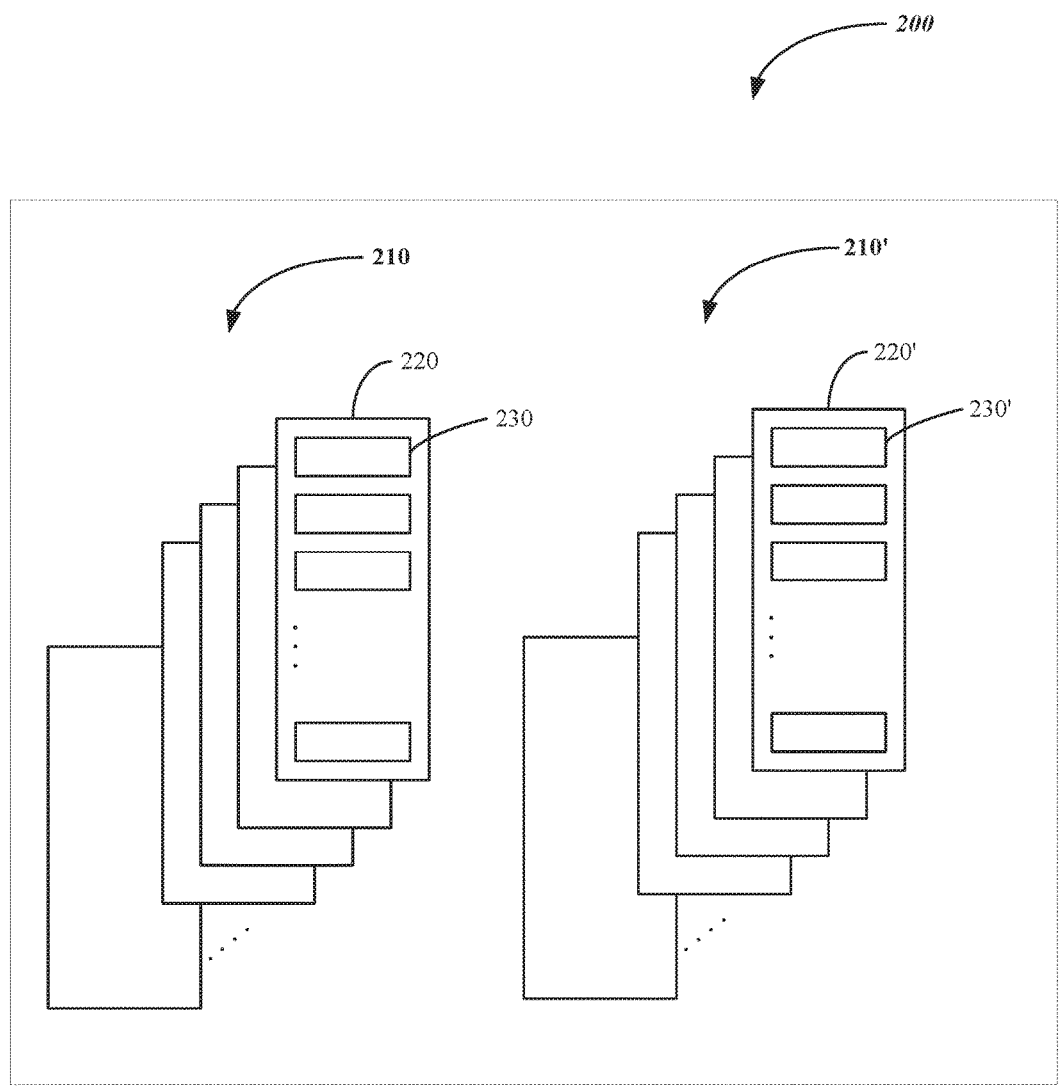
FIG. 2 is a simplified illustration of the organization of an example non-volatile memory die, according to embodiments.
Figure 3A:
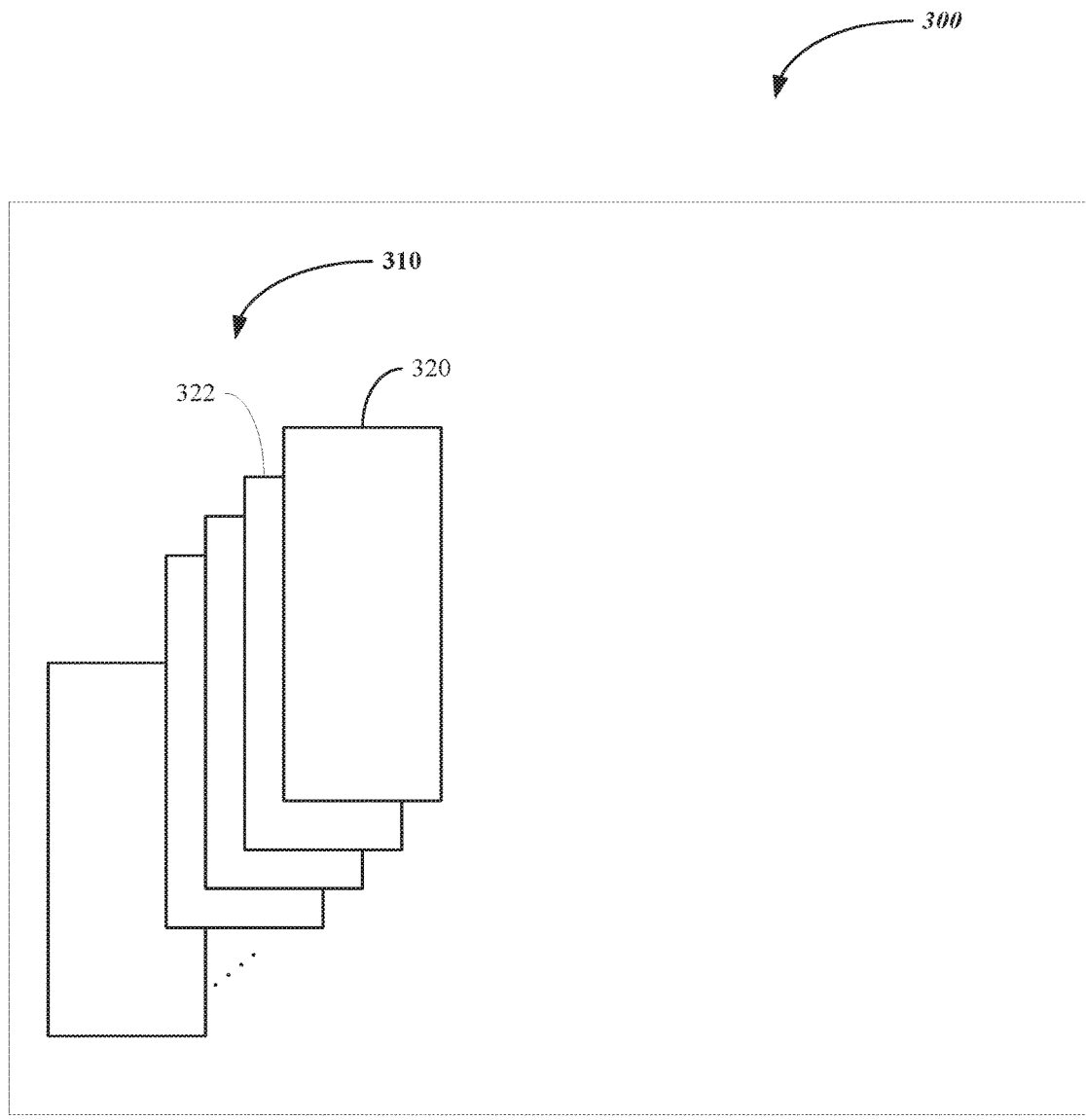
FIG. 3A, FIG. 3B, and FIG. 3C illustrate three examples of a victim block and a target block, according to embodiments.
Figure 3B:
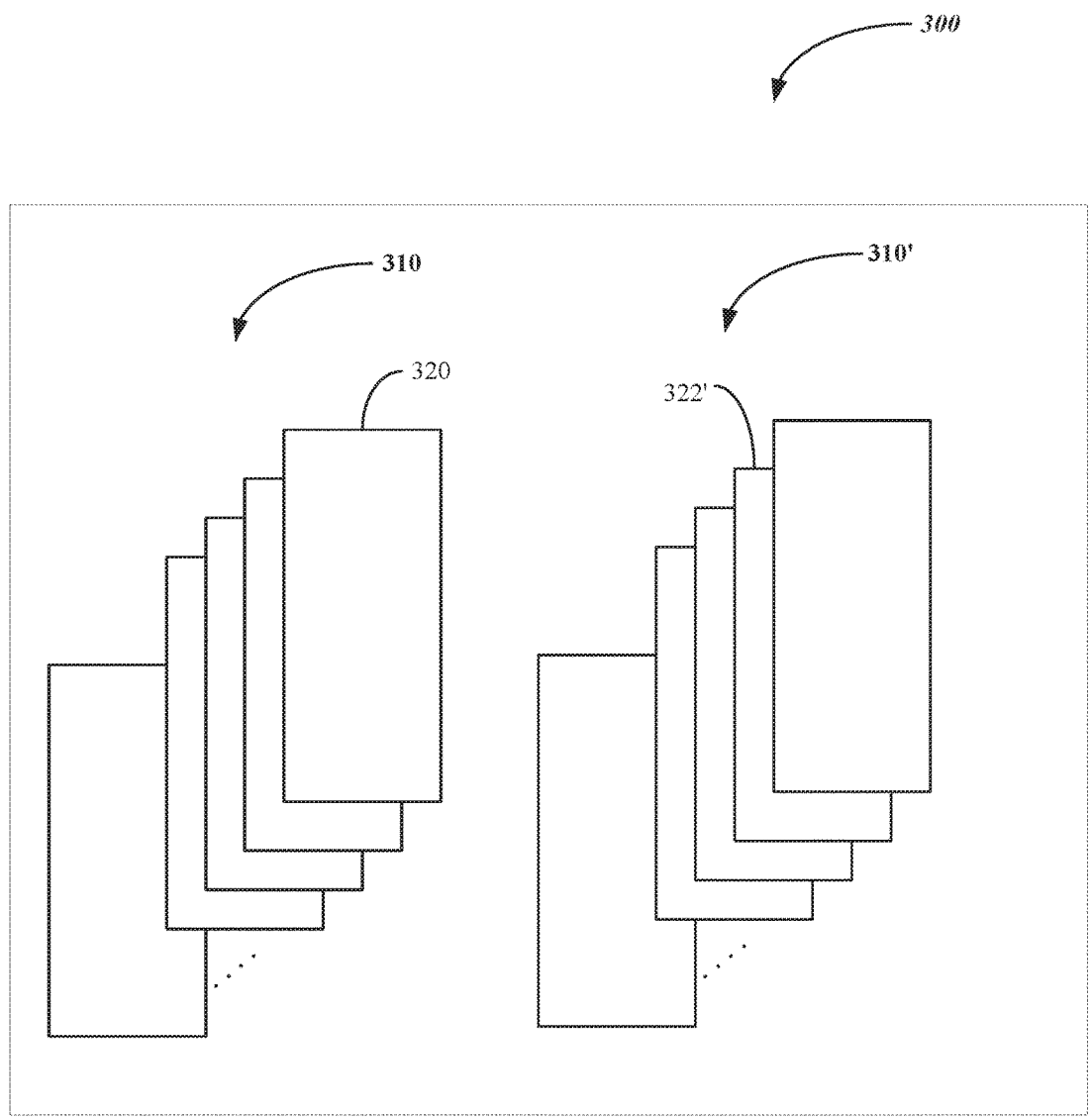
Figure 3C:
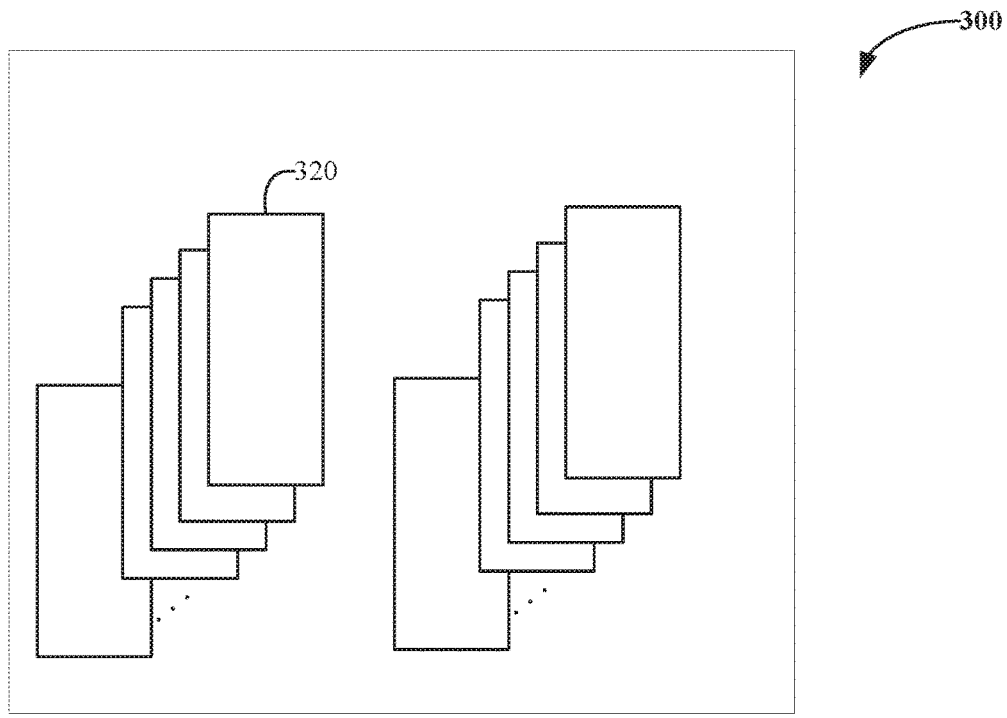
Figure 3C:
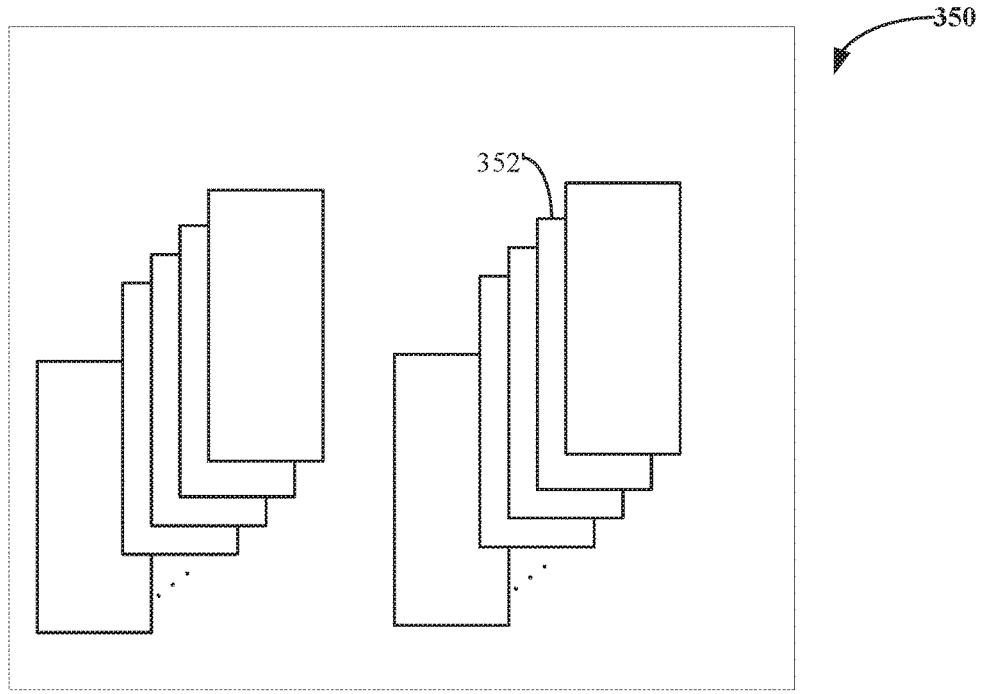
Figure 4:
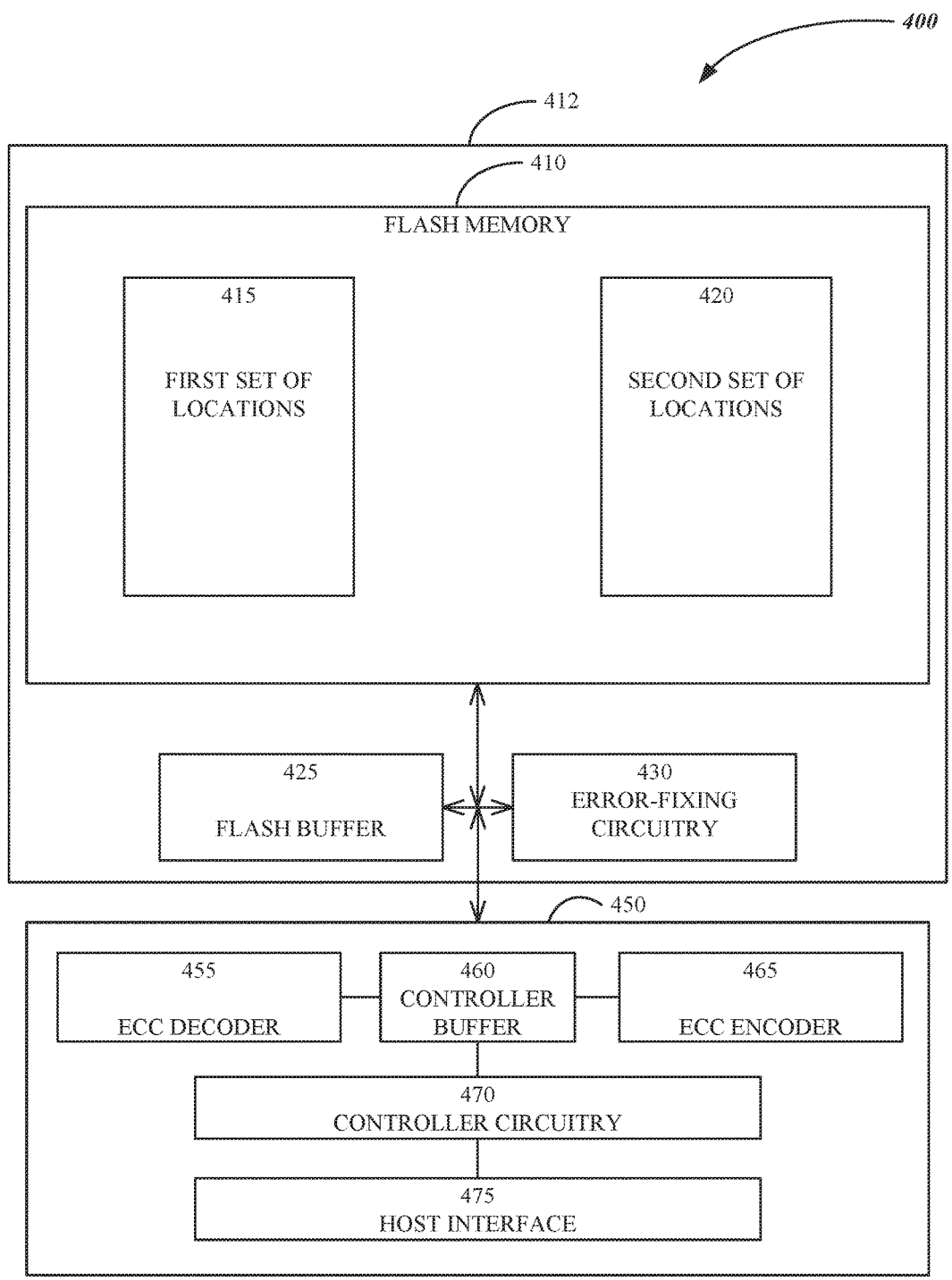
FIG. 4 is a simplified block diagram illustrating a flash memory device according to some embodiments.
Figure 5:
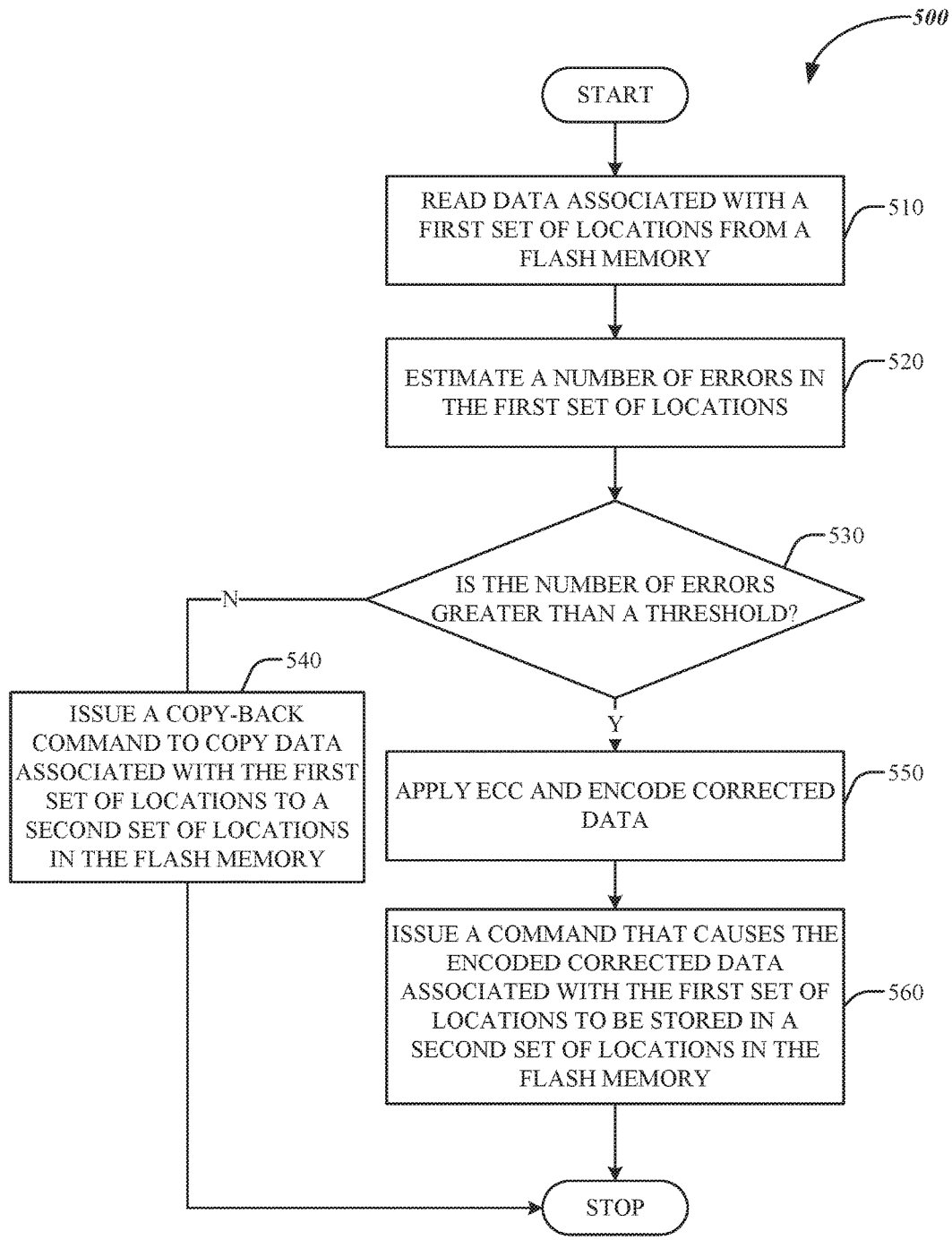
FIG. 5 is a flowchart illustrating a method of moving data in a flash memory according to embodiments.
Figure 6:
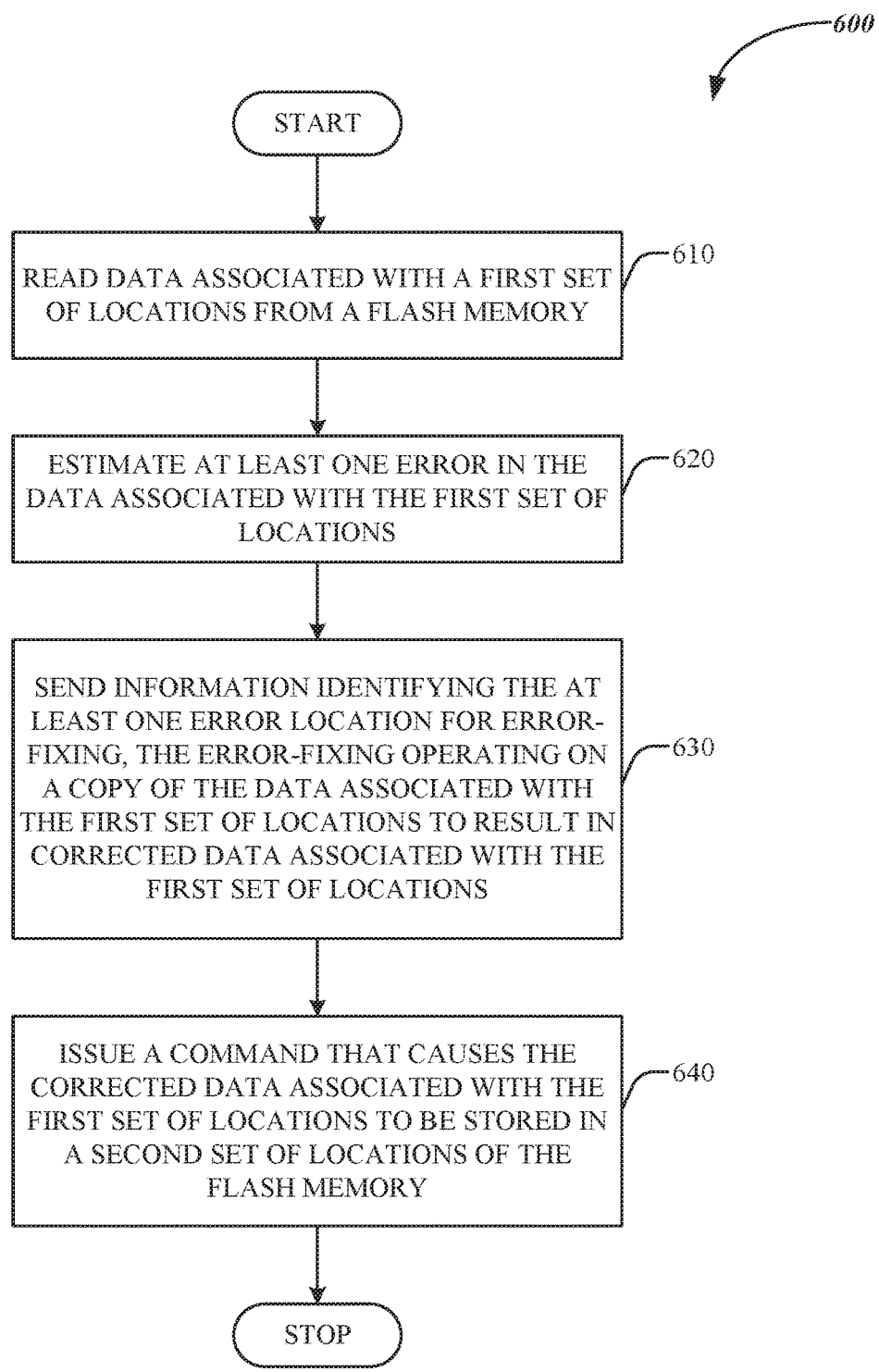
FIG. 6 is a flowchart illustrating another method of moving data in a flash memory according to embodiments.
Figure 7:
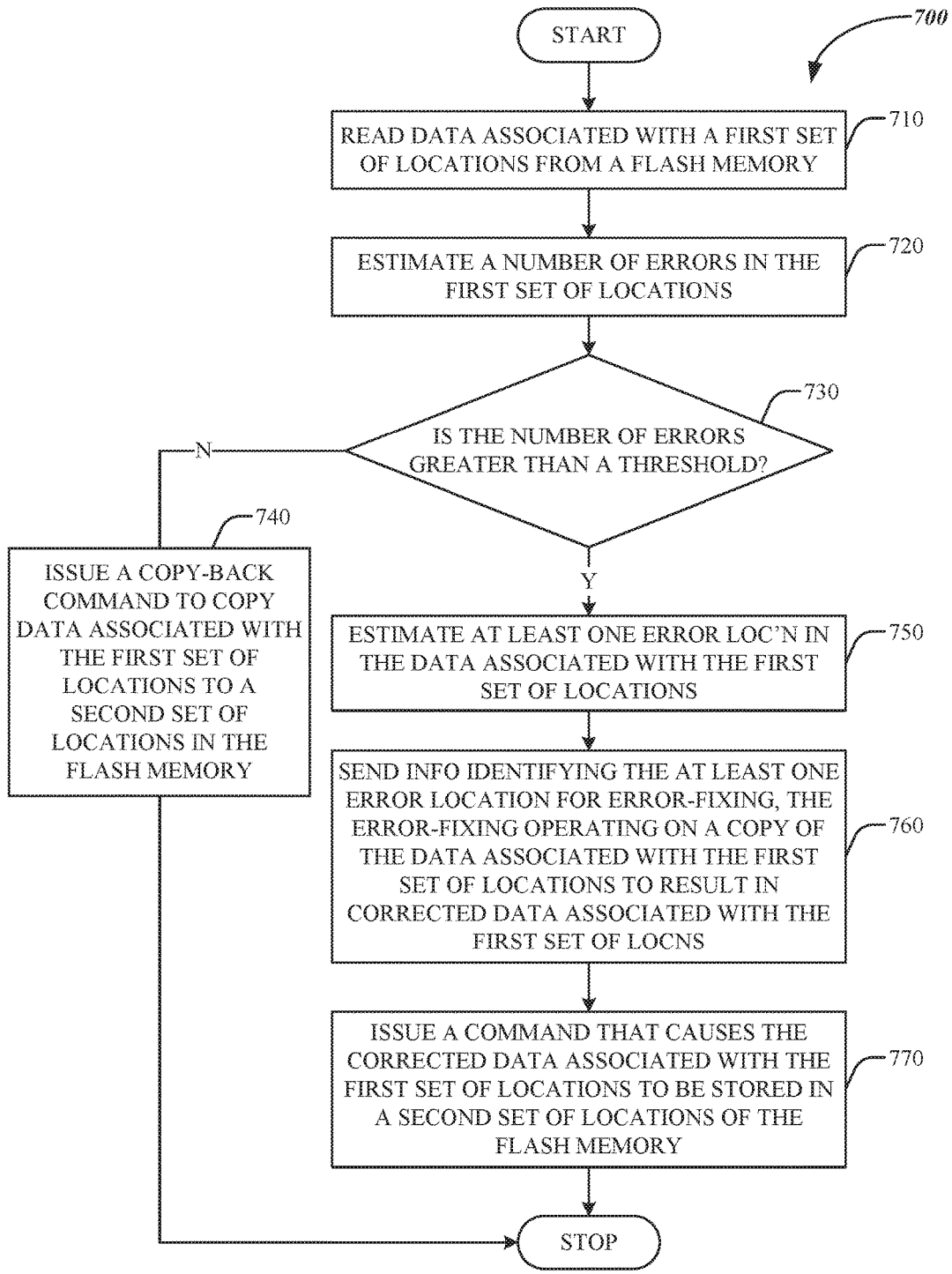
FIG. 7 is a flowchart illustrating another method of moving data in a flash memory according to embodiments.
Figure 8:
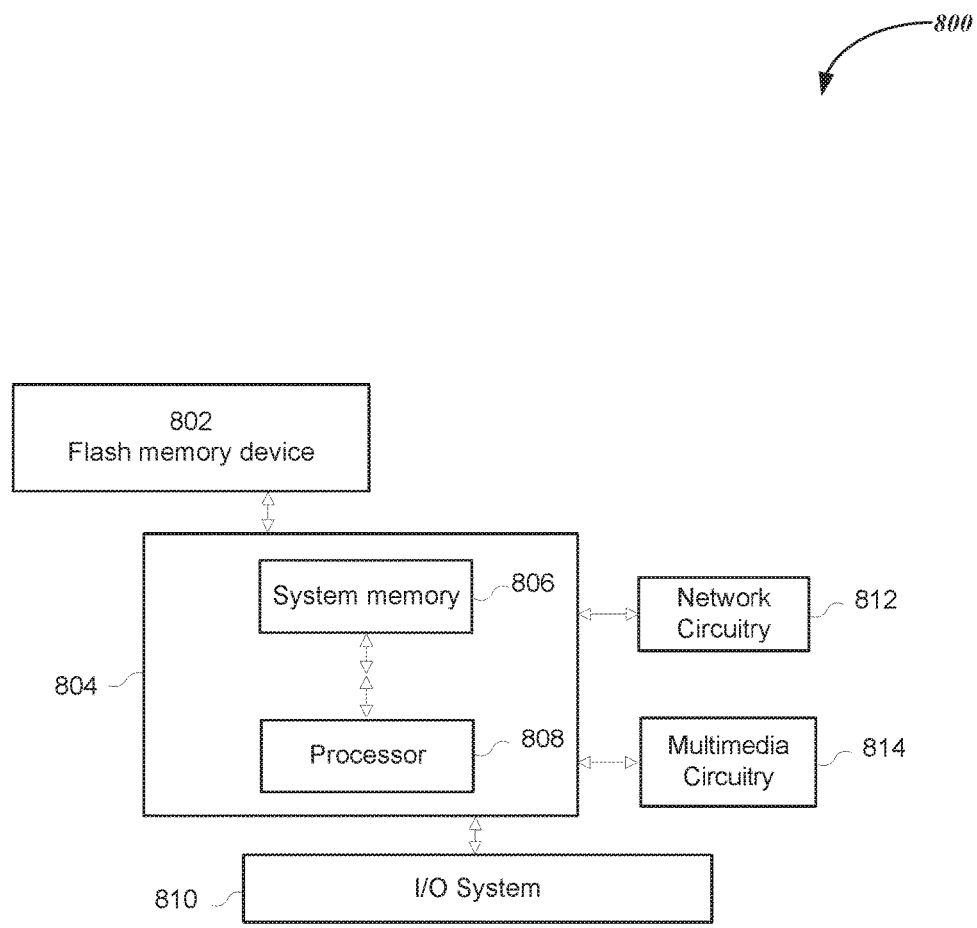
FIG. 8 is a simplified illustration of a computer device comprising an embodiment.

FIG. 1 describes the general high level architecture of a system comprising a host, a flash memory controller, and a flash memory. FIG. 2 describes an examples of the structure of a flash memory. FIG. 3A, FIG. 3B, and FIG. 3C illustrate three examples of a victim block and a target block. FIG. 4 is a simplified block diagram illustrating a flash memory device according to some embodiments. FIG. 5-7 are flowcharts illustrating methods of moving data in a flash memory according to embodiments. FIG. 8 is a simplified illustration of a computer device comprising an embodiment.

FIG. 1 is a simplified block diagram illustrating a system 100 including a host 110, a flash memory controller 120, and a flash memory 130, according to embodiments. In some implementations, flash memory 130 can be a NAND flash. In other implementations, non-volatile memory 130 can be a NOR flash memory configured to interact externally as a NAND flash. Flash memory 130 can be designed to store data in the absence of a continuous or substantially continuous external power supply. In some examples, flash memory 130 can be used for secondary data storage, for example, in a computer system such as a laptop. In such examples, a flash memory device 140 can replace a magnetic hard disk drive (HDD). In some examples, flash memory controller 120 can be external to flash memory device 140. In some such examples, flash memory controller 120 can interact with a plurality of flash memories. The architecture and organization of one example flash memory will be provided later in the specification. In some embodiments, other non-volatile memory can be used in place of or in addition to flash memory 130. Examples can include read only memory (ROM), a mask ROM (MROM), a programmable ROM (PROM), an erasable programmable ROM (EPROM), an electrically erasable programmable ROM (EEPROM), Ferroelectric RAM (F-RAM), Magnetoresistive RAM (RAM), polymer-based organic memory, holographic memory, phase change memory and the like.

Host 110 can include any appropriate hardware device, software application, or a combination of hardware and software. In some embodiments, host 110 can include a host-side controller (not shown). In embodiments, controller 120 can interface between host 110 and non-volatile memory 130. Controller 120 can be configured to receive various commands from host 110 and interface with non-volatile memory 130 based on these commands. Controller 120 can enable flash memory 130 to perform various operations based on control signals received from host 110. In examples, this can enable host 110 to program, erase, read, or trim parts of flash memory 130.

In some embodiments, in addition to or instead of an internal volatile memory, controller 120 can interface with an external volatile memory. For example, controller 120 can have access to an external DRAM where data can be stored before being transferred to a non-volatile memory.

FIG. 2 is a simplified illustration of the organization of an example flash memory 130, according to embodiments. It is to be noted that the structure shown in FIG. 2 is for illustrative purposes only and the actual physical organization of the flash memory can differ substantially from the depiction.

In the example shown in FIG. 2, flash memory die 200 comprises two planes 210 and 210'. Other examples can include a different number of planes per die. A plurality of such dies can be included in a flash memory, such as flash memory 130. Plane 210 can comprise a plurality of blocks, such as block 220. Plane 210' can include a plurality of blocks, such as block 220'. Block 220 can further comprise a plurality of pages 230. A page, such as page 230, may share a common word-line and can represent a minimum programmable unit. A page can also represent the minimum readable unit. A block can represent the smallest erasable unit.

Dies such as flash memory die 200 can be organized using different channels. Each channel can have multiple dies attached to it. For example, the first block from the first die, the first block from the second die, the first block from the third die, and so on, can be grouped together and accessed in parallel, thereby forming a superblock. Pages belonging to the same superblock can be, for example, programmed and read in parallel. Although a superblock may not be physically grouped in a unit, logically, a superblock can behave as a block.

In example, flash memory devices, program and erase operations take place at a 'page' level, while blocks can represent the smallest unit that can be erased. When data in an existing page has to be updated, the entire block has to be erased before the updated data is reprogrammed. In these flash memory devices, the system can reserve a certain number of free blocks to be used when an update request, i.e., a new program request, is received.

When the flash memory receives a new program request to update data in a page, the updated data is stored in an empty page, and the old page is marked invalid or stale. This process can continue until the number of free blocks in the flash memory falls below a certain threshold number or percentage. When the number or percentage of free blocks falls below the threshold, a 'garbage collection' procedure can be triggered. In the garbage collection procedure, valid data of programmed blocks (victim blocks') can be copied to free 'target' blocks, and the victim blocks can be marked as containing invalid data. All data in the invalid blocks can be erased at some point in time to increase the number of free blocks.

As explained above, this garbage collection process can include a step of copying data from a first set of locations (e.g., victim block) to a second set of locations (e.g., target block). Three example locations of victim blocks and target blocks are provided in FIGS. 3A-3C.

In FIG. 3A, one example of a victim block and target block is shown. Both the victim block 320 and the target block 322 are located in the same plane 310 and on the same die 300. In some examples, when methods from embodiments described below are applied to a case where the victim block and target block are on the same plane, latency of the copying process is lowest.

In FIG. 3B, another example of a victim block and target block is shown. Both the victim block 320 and the target block 322' are located on the same die 300; however, target block 322' is located on a different plane 310' from victim block 320, which is located in plane 310.

In FIG. 3C, another example of a victim block and target block is shown. Victim block 320 and target block 352' are located on different dies. Victim block 320 is located on die 300, whereas target block 352' is located in die 350. Existing commands may or may not support copying from one die to another.

FIG. 4 is a simplified block diagram illustrating a flash memory device 400 according to some embodiments. As shown in FIG. 4, flash memory device 400 includes a flash memory 410. In some embodiments, flash memory 410 can be a NAND flash memory, i.e., one based on NAND flash architecture such as the architecture described in FIG. 2. Flash memory 410 can include a first set of locations 415 and a second set of locations 420. In some embodiments, data associated with first set of locations 415 can represent source data to be copied to the second set of locations 420. In some embodiments, data associated with first set of locations 415 can be copied as-is to the second set of locations 420; whereas in other embodiments, data associated with first set of locations 415 can be corrected for errors, leading to corrected data associated with the first set of locations, before being copied or moved to second set of locations 420.

In some embodiments, first set of locations 415 can be present in a victim block, such as block 320 of FIG. 3; and second set of locations 420 can be present in a target block, such as block 322 of FIG. 3.

As shown in FIG. 4, flash memory device 400 can include a flash buffer 425. In some embodiments, flash buffer 425 can comprise a page buffer, used to store data related to the corresponding page. For example, the page buffer in flash buffer 425 can be used to store data read from the page or data to be written to the page. In some examples, flash buffer 425 can comprise other storage area. In some embodiments, when a read command is issued by a flash memory controller, flash buffer 425 can be used to store data fetched from flash memory 410. In particular, flash buffer 425 can be used to store a copy of the data associated with first set of locations 415. In some embodiments, flash buffer 425 can also be used to store a copy of the data associated with first set of locations 415 when an error-fixing operation is performed on the copy of the data associated with first set of locations 415.

Flash memory device 400 also includes error-fixing circuitry 430 coupled to flash memory 410. Although not shown in FIG. 4, error-fixing circuitry 430 can be part of a flash memory circuitry operably coupled to flash memory 410. As shown in FIG. 4, flash buffer 425 and error-fixing circuitry 430 are included in the flash memory chip 412.

Flash memory device 400 can also include a flash memory controller 450. In examples, flash memory controller 450 can include an Error Correction Code (ECC) decoder 455, a controller buffer 460, an ECC encoder 465, controller circuitry 470, a host interface 475, and a flash memory interface (not shown in FIG. 4). Such a flash memory interface can include elements (e.g., hardware, software, firmware or any combination thereof) necessary for supporting a flash memory interface protocol. While still forming part of flash memory device 100, in some embodiments, flash memory controller 450 can physically form a separate device from flash memory chip 412. In other embodiments, flash memory controller 450 can be integrated with flash memory chip 412 to form flash memory device 400.

Data can be obtained from flash memory 410 though the flash memory interface and stored in controller buffer 460. ECC decoder 455 can be used to decode and correct errors in the data present in controller buffer 460. In certain implementations, flash memory controller 450, using ECC decoder 455, can be used to estimate a count of errors in the copy of the data associated with first set of locations 415. Examples of ECC can include Hamming codes for SLC NAND flash and Reed-Solomon codes and Bose-Chaudhuri-Hocquenghem codes for MLC NAND flash. In some embodiments, error correction codes can be internally generated. In some embodiments, data in controller buffer 460 can be corrected, encoded by ECC encoder 465, and sent to flash memory 410, for example, to be stored in second set of locations 420. However, in other embodiments, other methods can make ECC correction and re-encoding unnecessary as described later in the specification.

Controller circuitry 470 can refer to any processing logic, including but not limited to a processor or processing core associated with a processor, Application Specific Integrated Circuit (ASIC), Field Programmable Gate Array (FPGA), or any other circuitry configurable to execute instructions. Although not shown in FIG. 4, flash memory controller 450 can further comprise a volatile memory such as a DRAM, a Double Data Rate DRAM (DDR DRAM), or a Static RAM (SRAM). In general, the volatile memory can refer to any memory media where the stored data is lost in the absence of continuous or substantially continuous power supply.

Host interface 475 can be used to communicate with a host, such as host 110 of FIG. 1. Host interface 475 can include elements (e.g., hardware, software, firmware or any combination thereof) necessary for supporting a host interface protocol.

In some implementations, for example, in a garbage collection procedure where data needs to be moved from first set of locations 415 in a victim block to second set of locations 420 in a target bock, flash memory controller 450 can issue a command to read the data associated with first set of locations 415. Based on such a command, a copy of the data associated with first set of locations 415 can be read into flash buffer 415. Further, the copy of the data associated with first set of locations 415 can be read (or 'fetched' or copied) to controller buffer 460 of flash memory controller 450 (for example, byte by byte). Using ECC decoder 455 and associated circuitry from controller circuitry 470, flash memory controller 450 can decode and correct the errors in the copy of the data associated with first set of locations 415 present in controller buffer 460. Corrected data can be encoded and sent byte by byte by flash memory controller 450 to flash buffer 415 with instructions from flash memory controller 450 to program the corrected data to second set of locations 420 in the target block. The corrected data can be programmed into second set of locations 420 in the target block.

This way, data associated with first set of locations 415 can be moved with error-correction to second set of locations 420, in examples, as part of garbage collection. The latency of the procedure described above can be high because of the time involved in decoding, error correction by ECC, re-encoding, and/or sending of corrected data from flash memory controller 450 to flash buffer 425.

FIG. 5 is a flowchart illustrating a process 500 of moving data in a flash memory from a first set of locations to a second set of locations according to embodiments. One example where process 500 can be applied is in a garbage collection process in a NAND flash memory. Although process 500 is explained below as it is performed by flash memory device 400 of FIG. 4, it should be noted that other systems and apparatus can be used in place of flash memory device 400 to perform process 500 and other processes described in the disclosure.

At step 510, process 500 includes reading data associated with the first set of locations from the flash memory. In some embodiments, step 510 can represent a part of, and can be triggered by, the initiation of the garbage collection process. The garbage collection process itself can be triggered, for example, when the number of available free blocks falls below a certain threshold. For example, when a write command is issued by a host to a flash memory controller, firmware resident in the flash memory controller, which tracks the number of free blocks in the flash memory, can initiate a reclamation of blocks through garbage collection. Garbage collection can include moving valid data from victim blocks to target blocks, so that victim blocks can then be erased.

In examples, the read command itself can be issued by flash memory controller 450. In some embodiments, first set of locations 415, which can represent physical addresses corresponding to logical addresses received from a host, can be determined by firmware resident on flash memory controller 450. In some embodiments, a copy of the data associated with first set of locations 415 can be made to flash buffer 425, and subsequently to controller buffer 460 via a flash memory interface on flash memory controller 450.

At step 520, process 500 includes estimating a number of errors in the first set of locations. In examples, ECC decoder 455 of flash memory controller 450 can decode and estimate or determine error locations using an ECC. In implementations, flash memory controller can also determine or estimate the number and addresses of error locations in the data associated with first set of locations 415. In some embodiments, data is stored in flash memory 410 in binary form, i.e. "1"s and "0"s.

At step 530, process 500 includes determining if the number or errors in the data associated with the first set of locations is greater than a threshold. In some embodiments, such a determination can be made by flash memory controller 450 using ECC and/or controller circuitry 470. In some embodiments, flash memory controller 450 can make the determination of step 530 while operating on a copy of the data associated with the first set of locations 415 present in controller buffer 460. The copy of the data associated with the first set of locations 415 present in controller buffer 460 can be the same as the data associated with the first set of locations 415 because the read into flash buffer 425 and subsequently into controller buffer 460 can be substantially error free.

If the number of errors in not greater than a threshold value, at step 540, process 500 includes issuing a copy-back command to copy the data associated with the first set of locations to the second set of locations in the flash memory. In some implementations, the threshold value can be calculated accounting for errors already present in the data associated with the first set of locations (such as from data retention losses, program-erase cycling, and disturbs) and errors that could be introduced from a subsequent programming operation to cause the data to be stored in the second set of locations. In some embodiments, where process 500 is part of garbage collection, the second set of locations can be present in a target block. In some embodiments, the command to copy the data associated with the first set of locations to the second set of locations can be issued by flash memory controller 450. The data associated with first set of locations 415 can be copied to second set of locations 420 as-is, without any error correction. In some embodiments, a command other than a 'copy back' command can be used, whereby the data associated with first set of locations 420 is copied to second set of locations 420 without being routed through flash memory controller 450. When compared to a method of copying data that includes decoding, ECC and encoding at the flash memory controller, process 500 can result in improved latency. This is because flash memory controller 450 does not have to re-encode corrected data to a new code word. Because the number of errors in the data associated with the first set of locations has been determined to be low, subsequent read of the data from the second set of locations can be corrected by ECC.

If the number of errors is greater than a threshold value, at step 550, process 500 includes applying ECC and encoding corrected data to result in corrected, encoded data. At step 560, process 500 includes issuing a command that causes the encoded corrected data associated with the first set of locations to be stored in a second set of locations in the flash memory.

In implementations, using ECC decoder 455 and associated circuitry from controller circuitry 470, flash memory controller 450 can decode and correct the errors in the copy of the data associated with first set of locations 415 present in controller buffer 460. Corrected data can be encoded and sent byte by byte by flash memory controller 450 to flash buffer 415 with instructions from flash memory controller 450 to program the corrected data to second set of locations 420 in the target block. The corrected data can be programmed into second set of locations 420 in the target block.

When the number of errors is low enough to potentially be correctible by ECC, process 500 provides the advantage of lower latency by skipping the steps of the flash memory controller encoding corrected data and sending it to the flash memory.

FIG. 6 is a flowchart illustrating a process 600 of moving data in a flash memory from a first set of locations to a second set of locations according to embodiments. One example where process 600 can be applied is in a garbage collection process in a NAND flash memory. Although process 600 is explained below as it is performed by flash memory device 400 of FIG. 4, it should be noted that other systems and apparatus can be used in place of flash memory device 400 to perform process 600 and other processes described in the disclosure.

At step 610, process 600 includes reading data associated with the first set of locations from the flash memory. In some embodiments, step 610 can represent a part of, and can be triggered by the initiation of the garbage collection process. The garbage collection process itself can be triggered, for example, when the number of available free blocks falls below a certain threshold. For example, when a write command is issued by a host to a flash memory controller, firmware resident in the flash memory controller, which tracks the number of free blocks in the flash memory, can initiate a reclamation of blocks through garbage collection. Garbage collection can include moving valid data from victim blocks to target blocks, so that victim blocks can then be erased.

In examples, the read command itself can be issued by flash memory controller 450. In some embodiments, first set of locations 415, which can represent physical addresses corresponding to logical addresses received from a host, can be determined by firmware resident on flash memory controller 450. In some embodiments, a copy of the data associated with first set of locations 415 can be made to flash buffer 425, and subsequently to controller buffer 460 via a flash memory interface on flash memory controller 450. As explained with reference to FIGS. 3A-3C, in some embodiments, the first set of locations and the second set of locations can be on the same plane of the flash memory. In other embodiments, the first set of locations can be on a first plane of the flash memory (FIG. 3A), and the second set of locations can be on a second plane of the flash memory (FIG. 3B).

At step 620, process 600 includes estimating at least one error in the data associated with the first set of locations. Although not included as part of flow 600, in some embodiments, if there are no errors in the data associated with the first set of locations, a step, such as step 540 of FIG. 5, can be used to copy data from the first set of locations to the second set of locations using a copy back command.

In examples, ECC decoder 455 of flash memory controller 450 can decode and estimate or determine error locations using an ECC. The estimating the at least one error location in the data associated with the first set of locations can comprise applying an Error Correction Code (ECC) algorithm to the data associated with the first set of locations. In implementations, flash memory controller can also determine or estimate the number and addresses of error locations in the data associated with first set of locations 415. In some embodiments, data is stored in flash memory 410 in binary form, i.e., "1"s and "0"s. In such embodiments, corrected data can be obtained for data in the error locations by bit flipping—i.e., switching '0's to '1's and vice versa.

At step 630, process 600 includes sending information identifying the at least one error location for error-fixing, the error fixing operating on a copy of the data associated with the first set of locations to result in corrected data associated with the first set of locations. In some embodiments, flash memory controller 450 can send the information identifying the at least one error location for error-fixing based on the errors and error locations estimated in step 620, for example, by issuing a send command. In such embodiments, the information identifying the at least one error location can refer to addresses of the error locations, or encoded addresses of the error locations. Because information identifying the at least one error location is sent to flash buffer 425 in step 630 as opposed to the entire corrected encoded data, the total size of information sent by flash memory controller 450 is much lesser. Hence, latency can also be significantly improved in process 600 when compared to processes where corrected and encoded data is sent to the flash memory by the flash memory controller as explained with reference to the example below.

When data is stored in the flash memory in binary form, the error-fixing can comprise a binary flip (changing a 0 to a 1 or a 1 to a 0) of a bit at the one error location in the copy of the data associated with the first set of locations.

In some embodiments, the error-fixing can occur at flash buffer 425 coupled to the flash memory. In some embodiments, data associated with the first set of locations can be present in flash buffer 425 from an earlier read operation, such as step 610. In other embodiments, a command can be issued from flash memory controller 450 to retrieve data from the first set of locations to flash buffer 425 in preparation for the error-fixing. The error-fixing can be performed or assisted by circuitry and/or logic in error-fixing circuitry 430.

At step 640, process 600 includes issuing a command that causes the corrected data associated with the first set of locations to be stored in a second set of locations in the flash memory. In some embodiments, the corrected data associated with the first set of locations can be present in flash buffer 425. In some embodiments, flash memory controller 450 can issue a modified copy back command to cause the corrected data associated with the first set of locations to be copied from flash buffer 425 to second set of locations 430. The copy back command can be modified over an existing copy back command. An existing copy back command, for example, may be issued to copy data as-is from a first set of locations in a flash memory to a second set of locations using internal circuitry present in flash memory 410. The modified copy back command, on the other hand, can be used to transfer or copy data from flash buffer 425 to second set of locations 430.

A summary of the latency saving when the flash memory controller sends addresses for error-fixing as opposed to the corrected data is shown in Table 1. In the example shown, the flash page is 16K bytes. For such a flash page, each address, i.e., each error location, can be represented using 17 bits. In the example in Table 1, the flash interface is assumed to be able to send 200 MBytes per second between flash controller and flash memory. Latency is numerically analyzed and estimated for two situations: when the entire data is sent, and when error addresses alone are sent.

TABLE 1

Latency comparison between two schemes: when the entire data is sent, and when error addresses alone are sent.

|  | Total Data size (send entire data scheme) | Latency (send entire data scheme) | Total Data size (send error address scheme) | Latency (send error address scheme) |
|---|---|---|---|---|
| 0.1% RBER | 16*1024*8 = 131072 bits | 82 us | 17*131 = 2227 (bits) | 1.39 us (98.3% decrease) |
| 0.2% RBER | 131072 bits | 82 us | 17*262 = 4454 (bits) | 2.78 us (96.6% decrease) |
| 0.5% RBER | 131072 bits | 82 us | 17*656 = 11152 (bits) | 6.96 us (91.5% decrease) |
| 1.0% RBER | 131072 bits | 82 us | 17*1312 = 22304 (bits) | 13.92 us (83.0% decrease) |

Table 1 illustrates the latency savings when error addresses or locations alone are sent for different Residual Bit Error Rates percentages (RBER). For example, in the first row, the RBER is 0.1%. When the entire corrected data associated with the first set of locations is sent by the flash memory controller to be stored in the second set of locations, the total data size is 131072 bits, as calculated by the size of the page in bits (with 8 bits in a byte). This leads to a latency of 82 µs. However, when only error locations are sent, the total data size is 17 times the estimated number of error locations (each error location requires 17 bits), which in this case is 2227 bits. The latency under this scheme is 1.39 µs, which is a 98.3% improvement. Other examples are provided for different RBER, and all of them show marked improvement when only error locations are sent.

Under the scheme where only error locations are sent by the flash memory controller, the error-fixing occurring elsewhere (for example, at flash buffer 425) can introduce some latency. However, the error-fixing, in examples, comprising of bit flipping, typically comprises simple logic. Hence, the latency introduced by error-fixing using error locations would be significantly lesser than the latency saved by at least (1) skipping ECC encoding in the flash controller; and (2) sending error locations instead of sending all of the data from the flash memory controller to the flash memory, leading to a net reduction in latency.

FIG. 7 is a flowchart illustrating a process 700 of moving data in a flash memory from a first set of locations to a second set of locations according to embodiments. One example where process 700 can be applied is in a garbage collection process in a NAND flash memory. Although process 700 is explained below as it is performed by flash memory device 400 of FIG. 4, it should be noted that other systems and apparatus can be used in place of flash memory device 400 to perform process 700 and other processes described in the disclosure.

At step 710, process 700 includes reading data associated with the first set of locations from the flash memory. In some embodiments, step 710 can represent a part of, and can be triggered by the initiation of the garbage collection process. The garbage collection process itself can be triggered, for example, when the number of available free blocks falls below a certain threshold. For example, when a write command is issued by a host to a flash memory controller, firmware resident in the flash memory controller, which tracks the number of free blocks in the flash memory, can initiate a reclamation of blocks through garbage collection. Garbage collection can include moving valid data from victim blocks to target blocks, so that victim blocks can then be erased.

In examples, the read command itself can be issued by flash memory controller 450. In some embodiments, first set of locations 415, which can represent physical addresses corresponding to logical addresses received from a host, can be determined by firmware resident on flash memory controller 450. In some embodiments, a copy of the data associated with first set of locations 415 can be made to flash buffer 425, and subsequently to controller buffer 460 via a flash memory interface on flash memory controller 450. As explained with reference to FIGS. 3A-3C, in some embodiments, the first set of locations and the second set of locations can be on the same plane of the flash memory. In other embodiments, the first set of locations can be on a first plane of the flash memory (FIG. 3A), and the second set of locations can be on a second plane of the flash memory (FIG. 3B).

At step 720, process 700 includes estimating a number of errors in the first set of locations. In examples, ECC decoder 455 of flash memory controller 450 can decode and estimate or determine error locations using an ECC. In implementations, flash memory controller can also determine or estimate the number and addresses of error locations in the data associated with first set of locations 415. In some embodiments, data is stored in flash memory 410 in binary form, i.e., "1"s and "0"s.

At step 730, process 700 includes determining if the number or errors in the data associated with the first set of locations is greater than a threshold. In some embodiments, such a determination can be made by flash memory controller 450 using ECC and/or controller circuitry 470. In some embodiments, flash memory controller 450 can make the determination of step 530 while operating on a copy of the data associated with the first set of locations 415 present in controller buffer 460. The copy of the data associated with the first set of locations 415 present in controller buffer 460 can be the same as the data associated with the first set of locations 415 because the read into flash buffer 425 and subsequently into controller buffer 460 can be substantially error free.

If the number of errors is not greater than a threshold value, at step 740, process 700 includes issuing a copy-back command to copy the data associated with the first set of locations to the second set of locations in the flash memory. In some implementations, the threshold value can be calculated accounting for errors already present in the data associated with the first set of locations (such as from data retention losses, program-erase cycling, and disturbs) and errors that could be introduced from a subsequent programming operation to cause the data to be stored in the second set of locations. In some embodiments, where process 700 is part of garbage collection, the second set of locations can be present in a target block. In some embodiments, the command to copy the data associated with the first set of locations to the second set of locations can be issued by flash memory controller 450. The data associated with first set of locations 415 can be copied to second set of locations 420 as-is, without any error correction. In some embodiments, a command other that a 'copy back' command can be used, whereby the data associated with first set of locations 420 is copied to second set of locations 420 without being routed through flash memory controller 450.

At step 750, process 700 includes estimating at least one error in the data associated with the first set of locations.

In examples, ECC decoder 455 of flash memory controller 450 can decode and estimate or determine error locations using an ECC. The estimating the at least one error location in the data associated with the first set of locations can comprise applying an Error Correction Code (ECC) algorithm to the data associated with the first set of locations. In implementations, flash memory controller can also determine or estimate the number and addresses of error locations in the data associated with first set of locations 415. In some embodiments, data is stored in flash memory 410 in binary form, i.e., "1"s and "0"s. In such embodiments, corrected data can be obtained for data in the error locations by bit flipping—i.e., switching '0's to '1's and vice versa.

At step 760, process 700 includes sending information identifying the at least one error location for error-fixing, the error fixing operating on a copy of the data associated with the first set of locations to result in corrected data associated with the first set of locations. In some embodiments, flash memory controller 450 can send the information identifying the at least one error location for error-fixing based on the errors and error locations estimated in step 750, for example, by issuing a send command. In some embodiments, because information identifying the at least one error location is sent to flash buffer 425 in step 760, as opposed to corrected encoded data, the total size of information sent by flash memory controller 450 is much lesser. Hence, latency can also be significantly improved in process 700 when compared to processes where corrected and encoded data is sent to the flash memory by the flash memory controller. An illustration of the latency savings were provided above with reference to Table 1.

When data is stored in the flash memory in binary form, the error-fixing can comprise a binary flip (changing a 0 to a 1 or a 1 to a 0) of a bit at the one error location in the copy of the data associated with the first set of locations.

In some embodiments, the error-fixing can occur at flash buffer 425 coupled to the flash memory. In some embodiments, data associated with the first set of locations can be present in flash buffer 425 from an earlier read operation, such as step 610. In other embodiments, a command can be issued from flash memory controller 450 to retrieve data from the first set of locations to flash buffer 425 in preparation for the error-fixing. The error-fixing can be performed or assisted by circuitry and/or logic in error-fixing circuitry 430.

At step 640, process 600 includes issuing a command that causes the corrected data associated with the first set of locations to be stored in a second set of locations in the flash memory. In some embodiments, the corrected data associated with the first set of locations can be present in flash buffer 425. In some embodiments, flash memory controller 450 can issue a modified copy back command to cause the corrected data associated with the first set of locations to be copied from flash buffer 425 to second set of locations 430.

The copy back command can be modified over an existing copy back command. An existing copy back command, for example, may be issued to copy data as-is from a first set of locations in a flash memory to a second set of locations using internal circuitry present in flash memory 410. The modified copy back command, on the other hand, can be used to transfer or copy data from flash buffer 425 to second set of locations 430.

FIG. 8 illustrates an example computing device 800 comprising embodiments of the invention. Hardware elements of device 800 can be electrically coupled via a bus (or may otherwise be in communication, as appropriate). As shown in FIG. 8, computing device 800 includes processing unit 804, flash memory device 802, an input/output (I/O) system 810, network circuitry 812, and multimedia circuitry 814. In the example depicted, processing unit 804 can act as a host system.

In examples, flash memory device 802 can be a NAND flash memory device such as flash memory device 400 of FIG. 4, and can be used to store secondary data accessed by processing unit 804. Flash memory device 802 can include a flash memory controller (not shown) according to embodiments described above, acting as an interface between non-volatile memory device 802 and the processing unit 804. System memory 806 can be a volatile memory such as a Random Access Memory (RAM) and can operate in conjunction with processor 808. Processor 808 can include, without limitation, one or more general-purpose processors and/or one or more special-purpose processors (such as digital signal processing chips, graphics acceleration processors, and/or the like)

Computing device 800 can further include network circuitry 812 to connect computing device 800 to a network. The network circuitry can include without limitation a modem, a network card (wireless or wired), an infrared communication device, a wireless communication device and/or chipset (such as a Bluetooth™ device, an 1602.11 device, a WiFi device, a WiMax device, cellular communication facilities, etc.), and/or the like. Network circuitry 812 may permit data to be exchanged with a network, other devices, and/or any other devices described herein.

As shown in FIG. 8, computing device 800 can include multimedia circuitry 814. Multimedia circuitry 814 can connect computing device 800 to several external audio and video input and output, such as displays and speakers. I/O system 810 can connect computing device 800 to various input devices and mechanisms such as keyboards, mice, touchscreens, cameras, infra-red capture devices, and the like, and output devices and mechanisms such as a printer, a display unit, a haptic feedback device, and/or the like.

Computing device 800 also can comprise software elements, located within system memory 806 or in flash memory 802, including device drivers, executable libraries, and/or other code, such as one or more application programs, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device such as flash memory controller 450 of FIG. 4) to perform one or more operations in accordance with the described methods, for example, any of the methods illustrated in FIGS. 5-7.

A set of these instructions and/or code might be stored on a computer-readable storage medium, such as within flash memory device 802, or, in examples, within the flash memory controller in flash memory device 802. In some cases, the storage medium might be incorporated within a device, such as device 800 or flash memory device 802. In other embodiments, the storage medium might be separate from a device (e.g., a removable medium, such as a compact disc), and/or provided in an installation package, such that the storage medium can be used to program, configure and/or adapt a general purpose computer with the instructions/code stored thereon. These instructions might take the form of executable code, which is executable by a device and/or might take the form of source and/or installable code, which, upon compilation and/or installation on a device (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

The terms "machine-readable medium" and "computer-readable medium," as used herein, refer to any medium that participates in providing data that causes a machine to operate in a specific fashion. While illustrative embodiments of the application have been described in detail herein, it is to be understood that the inventive concepts may be otherwise variously embodied and employed, and that the appended claims are intended to be construed to include such variations, except as limited by the prior art.

What is claimed is:

1. A method for moving data in a flash memory, comprising:
   reading, by a flash memory controller, data associated with a first set of locations from the flash memory;
   determining, using an error-correction code (ECC) decoder at the flash memory controller, at least one error location in the data associated with the first set of locations;
   sending, from the flash memory controller, information identifying the at least one error location for error-fixing, the error-fixing operating on a copy of the data associated with the first set of locations to result in corrected data associated with the first set of locations, wherein the error-fixing comprises a binary flip of an error bit at the at least one error location in the copy of the data associated with the first set of locations without copying corrected data based on ECC encoding from the flash memory controller to the flash memory; and
   issuing, from the flash memory controller, a command that causes the corrected data associated with the first set of locations to be stored in a second set of locations of the flash memory, the second set of locations different from the first set of locations.

2. The method of claim 1, further comprising:
   determining, at the flash memory controller, that a condition is satisfied based on a count of locations with errors in the first set of locations, and wherein the sending the information identifying the at least one error location is based on the condition being satisfied.

3. The method of claim 2, wherein the condition is based on a threshold number of locations with errors in the first set of locations.

4. The method of claim 2, wherein the condition is based on a threshold percentage of locations with errors in the first set of locations.

5. The method of claim 1, wherein the determining the at least one error location in the data associated with the first set of locations comprises applying an Error Correction Code (ECC) algorithm to the data associated with the first set of locations.

6. The method of claim 1, wherein the moving data in the flash memory occurs as part of a garbage collection process in a NAND flash memory device.

7. The method of claim 1, wherein the error-fixing occurs at a flash buffer coupled to the flash memory.

8. The method of claim 1, wherein the command that causes the corrected data associated with the first set of locations to be stored in a second set of locations comprises a modified copy back command.

9. The method of claim 1, wherein the first set of locations and the second set of locations are on a same plane of the flash memory.

10. The method of claim 1, wherein the first set of locations is on a first plane of the flash memory, and the second set of locations is on a second plane of the flash memory.

11. A flash memory device configured to move data associated with a first set of locations to a second set of locations, comprising:
 a flash memory;
 a flash buffer coupled to the flash memory;
 a flash memory controller configured to:
  cause the data associated with the first set of locations from the flash memory to be copied to the flash buffer;
  read the data associated with the first set of locations into the flash memory controller;
  determine, using an error-correction code (ECC) decoder, at least one error location in the data associated with the first set of locations;
  issue a command that causes a corrected data associated with the first set of locations to be stored in the second set of locations, the second set of locations different from the first set of locations; and
 error-fixing circuitry coupled to the flash buffer and configured to:
  receive the information identifying the at least one error location for error-fixing; and
  issue a correction command to correct the copy of the data associated with the first set of locations in the flash buffer based on the information identifying the at least one error location to produce the corrected data associated with the first set of locations, wherein the correcting the copy of the data associated with the first set of locations in the flash buffer based on the information identifying the at least one error location includes performing a binary flip of an error bit at the at least one error location in the copy of the data associated with the first set of locations in the flash buffer without copying corrected data based on ECC encoding from the flash memory controller to the flash memory.

12. The flash memory device of claim 11 wherein the flash memory controller is further configured to:
 determine that a condition is satisfied based on a count of locations with errors in the first set of locations, and wherein the sending the information identifying the at least one error location is based on the condition being satisfied.

13. The flash memory device of claim 12, wherein the condition is based on a threshold number of locations with errors in the first set of locations.

14. The method of claim 12, wherein the condition is based on a threshold percentage of locations with errors in the first set of locations.

15. The flash memory device of claim 11, wherein the command that causes a corrected data associated with the first set of locations to be stored in the second set of locations comprises a modified copy back command.

16. The flash memory device of claim 11, wherein the move of data from the first set of locations to the second set of locations occurs as part of a garbage collection process, and the flash memory device is a NAND flash memory device.

17. The flash memory device of claim 11, wherein the first set of locations and the second set of locations are on a plane of the flash memory.

18. The flash memory device of claim 11, wherein the first set of locations is on a first plane of the flash memory, and the second set of locations is on a second plane of the flash memory.

19. A non-transitory computer-readable medium having stored thereon instructions that when executed by a processor perform a method, including:
 causing data associated with a first set of locations from a flash memory device to be copied to a flash buffer;
 reading the data associated with the first set of locations into a flash memory controller;
 determining, using an error-correction code (ECC) decoder, at least one error location in the data associated with the first set of locations;
 sending information identifying the at least one error location for error-fixing, the error-fixing operating on a copy of the data associated with the first set of locations to result in corrected data associated with the first set of locations, wherein the error-fixing comprises a binary flip of an error bit at the at least one error location in the copy of the data associated with the first set of locations without copying corrected data based on ECC encoding from the flash memory controller to the flash memory; and
 issuing a command that causes the corrected data associated with the first set of locations to be stored in a second set of locations, the second set of locations different from the first set of locations.

* * * * *